United States Patent [19]

Bergmann et al.

[11] 4,323,792
[45] Apr. 6, 1982

[54] TWO TERMINAL CIRCUITRY FOR VOLTAGE LIMITATION

[76] Inventors: Günther Bergmann, Markbronner St. 20, Blaustein-Arnegg, Fed. Rep. of Germany, 7906; Arthur Kessler, Obererlenbacher St. 26, Friedrichsdorf, Fed. Rep. of Germany, 6382

[21] Appl. No.: 966,689

[22] Filed: Dec. 5, 1978

Related U.S. Application Data

[63] Continuation of Ser. No. 858,046, Jun. 28, 1978, abandoned.

[51] Int. Cl.³ .................................................. H03K 5/08
[52] U.S. Cl. ..................................... 307/549; 328/171
[58] Field of Search .................. 307/237, 264; 361/90, 361/91; 328/168, 171; 340/248 C; 179/184, 1 VL, 81 R; 325/482

[56] References Cited

U.S. PATENT DOCUMENTS 3,523,198  8/1970  Keller .............................. 307/237 X
3,703,647  11/1972  Cowpland ......................... 307/237
3,916,114  10/1975  Persson ............................ 179/81 R

OTHER PUBLICATIONS

R. E. Werner, "Transistor Clipper" RCA Technical Notes No. 732, Jan., 1968.

Primary Examiner—John Zazworsky
Attorney, Agent, or Firm—Erwin Salzer

[57] ABSTRACT

A two terminal solid state device for voltage limitation comprises a controllable current path and a control electrode for the control thereof. A series arrangement of one or more diodes is connected with one of the ends thereof to said control electrode and with the other end thereof to one of said two terminals of the device. The latter is adapted to operate above the combined threshold voltages of said controllable current path and that of said one or more diodes.

2 Claims, 4 Drawing Figures

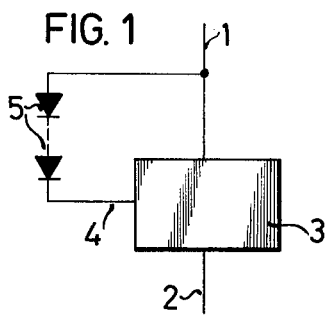
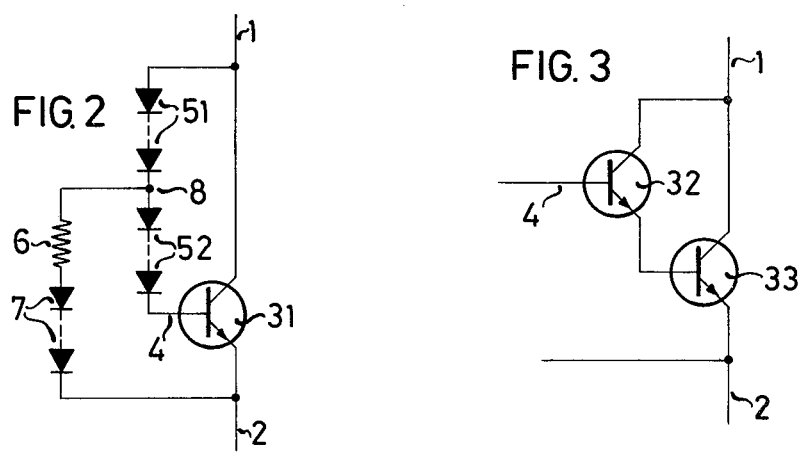
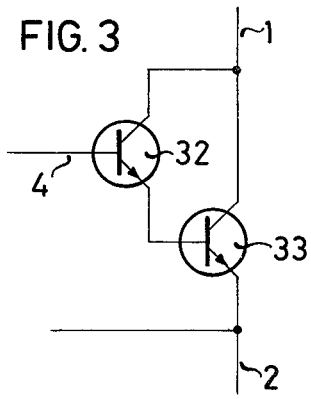
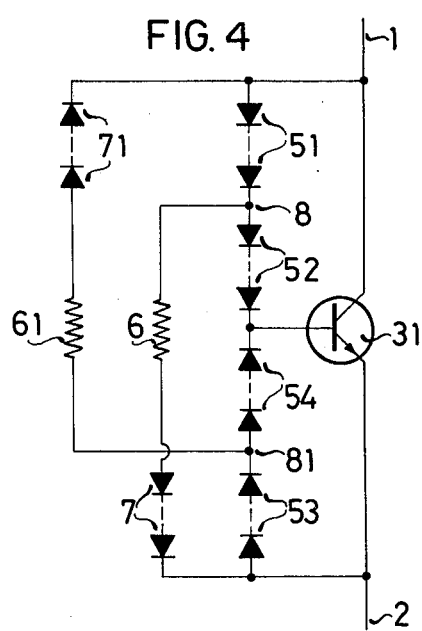

TWO TERMINAL CIRCUITRY FOR VOLTAGE LIMITATION

This is a continuation of application Ser. No. 858,046 filed 6/28/78 now abandoned, for TWO TERMINAL CIRCUITRY FOR VOLTAGE LIMITATION.

BACKGROUND OF THE INVENTION

Among the prior art surge voltage devices those consisting of a gas-filled tube having two electrodes may be mentioned, the tube being connected with one electrode to the line to be protected, and with the other electrode to ground. In operation such surge voltage protectors resemble glow-lamps. Their voltage limitation occurs only above a voltage of 200 volts. Therefore, voltage limiting devices of this nature cannot be applied for the protection of circuits including semiconductor devices, because surge voltages of that magnitude would result in a breakdown of the semiconductor.

Furthermore, so-called varistors have been applied as surge voltage protectors. Varistors consist of a semiconductor body with two electrodes. The resistance between the electrodes is independent of the direction of current flow and dependent upon the applied voltage. This is one of the limitations of the application of varistors for surge voltage protection. Varistors have the disadvantage of forming non-negligible shunts across the circuitry to be protected, even if the applied voltage is small. This is another limitation of the application of varistors for surge voltage protection.

For conducting surge voltages to ground diodes or series arrangements of diodes and/or Zener diodes have been proposed. These are, however, if available space is limited only suitable for dissipating small power surges. Zener diodes have the further disadvantage, particularly if monolithically integrated, of having substantial individual deviations.

It is, therefore, the principal object of this invention, to provide surge voltage protective devices not subject to the limitation of the above prior art devices.

A more special object of this invention is to provide means which limit a predetermined voltage approximately to a magnitude in the order of 3 volts, without significant deviations from the required value, and which are not bulky and capable of carrying currents in the order of 1 amp. without substantial voltage drop.

SUMMARY OF THE INVENTION

The invention refers to a two terminal circuitry for voltage limitation having a blocked state and a conductive state. The circuitry comprises a solid state device having two electrodes, and a controllable current path between said two control electrodes. The circuitry further includes an additional control electrode conductively connected to said two electrodes. A solid state device complying with this description is, for instance, a transistor.

The improvement according to this invention comprises (a) a first shunt connecting said additional control electrode to one of said two electrodes of said solid state device;

(b) said first shunt having a tap dividing said first shunt into a first shunt portion and a second shunt portion arranged in series with said first shunt portion;

(c) said first shunt portion including a first diode means allowing current flow from said first shunt portion toward said tap;

(d) said second shunt portion including second diode means allowing current flow in said second shunt portion toward said additional control electrode; and (e) a second shunt connecting said tap to said other of said two electrodes, said second shunt including a series arrangement of resistor means and third diode means oriented to allow a current flow from said tap to said other of said two electrodes.

The advantage of this structure relative to other prior art structures serving the same purpose resides in the fact that it establishes a very sharp kink, or bent, in the voltage limitation curve. In other words, the circuitry according to this invention has a very high ohmic value up to the point when it becomes operative, and its value breaks suddenly down when the threshold voltage is exceeded.

The voltage limitation which can be achieved with the subject matter of this invention is particularly desirable in connection with telephone circuits.

BRIEF DESCRIPTION OF THE DRAWINGS

FIG. 1 shows diagrammatically the principle underlying the present invention;

FIG. 2 shows an embodiment of the invention wherein the solid state device is formed by a transistor;

FIG. 3 is an embodiment of the invention wherein the solid state device is formed by a transistor Darlington circuit; and FIG. 4 is a symmetrical circuit for limiting surge voltages according to the present invention.

DESCRIPTION OF PREFERRED EMBODIMENTS

FIG. 1 shows, in principle, a circuitry for voltage limitation according to the present invention. The circuitry includes two terminals 1 and 2, the controllable current path of a solid state device 3 being arranged between said two terminals. The solid state device is controlled by its control electrode 4. A single diode 5 or a series arrangement of diodes 5 is connected to control electrode 4. The diode, or diodes 5, are also connected with terminal 1. In this circuitry the diode, or diodes 5, and the gap between terminals 4 and 2 become conductive, when the voltage across diode, or diodes 5, and the voltage across the control current path of semi conductor device 3 exceeds a predetermined value, i.e. the aggregate threshold voltages thereof.

In the simplest case the solid state device is a transistor, as shown in FIG. 2. In FIG. 2 the gap formed between the collector and the emitter of transistor 31 forms the controllable branch of the transistor, and the base forms the control electrode. The series arrangement of diodes 51,52 is tapped at 8 which will be discussed below in more detail. The above referred-to aggregate threshold voltages which must be exceeded to render the circuitry operative is the forward voltage of the diode or diodes required to make the same conductive, plus the threshold voltage across the base-emitter gap required to render the transistor 31 conductive. This voltage is about 0.5 volts at the PN-junction of silicon semiconductor devices.

In FIG. 3 the shunt diodes have been deleted. FIG. 3 shows merely the well known Darlington circuitry comprising the two transistors 32 and 33. The emitter of transistor 32 is connected to the base of transistor 33.

FIG. 3 may be derived from FIG. 2 by substituting transistor 31 plus its associated circuitry for transistor 32 of FIG. 3. The circuitry of FIG. 3 has the advantage over that of FIG. 2 of being capable of dissipating much higher surge power.

Referring now again to FIG. 2, connected to tap 8 arranged between diodes 51 and 52 which control transistor 31, is a branch circuit which comprises resistor 6 and at least one diode 7. The other end of branch circuit 6,7 is connected to the terminal 2 of a solid state device, in the instant case terminal 2 of transistor 31. In this circuitry the diode or diodes 7 are arranged in the same sense or direction as the diodes 51,52 controlling transistor 31 when they are conducting. The threshold voltage of branch 6,7 is less than the aggregate threshold voltages of the control gap of transistor 31 plus the threshold voltage of diodes 51 arranged ahead of tap 8. The diodes 51 and 52 and the base emitter gap of transistor 31 determine, in substance, the limit voltage of the device. The additional series connection of resistor 6 and diode or diodes 7 produces at the initiation range of the diodes a shunt, or by-pass, for transistor 31, so that for voltages below the threshold voltage the transistor 31 is positively blocked. The shunt comprising resistor 6 and diode or diodes 7 therefore effects a sharper bend in the characteristic of transistor 31 between its blocked condition and its conductive condition, and thus achieves a sharper definition of the voltage limitation of the device.

The circuitry of FIGS. 1 and 2 limit a voltage that is positive in regard to terminal 2. In case that it is necessary to limit positive as well as negative voltages, it is desirable to modify the circuitry according to FIG. 2 so as to form a bidirectional circuit. This can readily be achieved in monolithic integration, which allows to achieve a high degree of symmetry in regard to limitation of positive and negative voltage surges. It is, of course, possible by the proper choice of diodes to obtain an asymmetrical voltage limitation, i.e. one where the admitted positive and negative voltage peaks differ from each other.

The bidirectional or inverse parallel modification of the circuitry allows to manufacture transistors having high current amplifications also for that kind of operation. This can be achieved with one single transistor limiting both positive and negative surge voltages. As shown in FIG. 4, the two series circuits 51,52 and 6,7 of FIG. 2 are doubled, i.e. the circuit including tap 8, resistor 6, and diodes 7 is arranged in inverse polarity forming tap 81, resistor 61, and diodes 71. Tap 81 of series connected diodes 53 and 54 corresponds to tap 8 of series connected diodes 51,52, and while diodes 7,53 are connected to terminal 2, diodes 71,51 are connected to terminal 1. The term inverse parallel is applied to indicate that the polarity of diodes 53,54 and 71 is inverted in regard to that of diodes 51,52 and 7.

When the positive voltage at the terminal 1 exceeds the voltage at terminal 2 by the permissible threshold value diodes 51,52 and 7 become conductive and since the threshold value of diodes 7 is less than the aggregate threshold values of diodes 52 and that of the gap between the base and the emitter of transistor 31, transistor 31 turns into a controlled conductor. To this end it is necessary that the current flowing through resistor 6—which is in the order of 10 and 100 ohms—and diode 7 produces such a high voltage that transistor 31 is fully modulated.

When the voltage at terminal 2 exceeds that at terminal 1, a limitation of the voltage occurs, if diodes 53,54 and 71 become conductive, and the voltage drop along resistor 61—which is of the same magnitude as resistor 6—is sufficiently large to cause transistor 31 to operate inversely.

The elements of the circuit according to the present invention, in particular the diodes and the resistors, are subject only to extremely small losses, so as to be able to be implemented as small as technically possible. The duration during which this semiconductor circuitry is subject to excessive power is very short, so that the bulk of the semiconductor circuitry is also very small. Consequently several complete circuitries may be on a single semiconductor chip. This is particularly favorable if a plurality of lines or circuits are to be protected from overvoltages.

The small bulk of circuitries according to the present invention makes it even possible to integrate in communication systems, such as telephone systems, the above described circuitry with electronic coupling contacts.

A particular advantage of circuits embodying this invention lies in the fact that they may be applied as passive two terminal networks. Consequently no additional operating voltages are required. In monolithic integration the conventional negative substrate bias may be dispensed with since the substrate current may be neglected because of the lack of transistors which are saturated.

We claim as our invention:

1. A two terminal circuitry for voltage limitation having a blocked state and a conductive state, said circuitry comprising a solid state device having two electrodes, a controllable current path between said two electrodes, and an additional control electrode, said two electrodes being conductively connected to said additional control electrode, wherein the improvement comprises
    (a) a first shunt connecting said additional control electrode to one of said two electrodes of said solid state device;
    (b) said first shunt having a tap dividing said first shunt into a first shunt portion and a second shunt portion arranged in series with said first shunt portion;
    (c) said first shunt portion including first diode means allowing current flow from said first shunt portion toward said tap;
    (d) said second shunt portion including second diode means allowing current flow in said second shunt portion toward said additional control electrode; and
    (e) a second shunt connecting said tap to said other of said two electrodes, said second shunt including a series arrangement of resistor means and third diode means oriented to allow a current flow from said tap to said other of said two electrodes.

2. A two terminal circuit as specified in claim 1 wherein
    (a) said solid state device is a transistor including a base, a collector and an emitter;
    (b) said first shunt connects said base and said collector; and
    (c) said second shunt connects said tap and said emitter.

* * * * *